(12) United States Patent
Lee et al.

(10) Patent No.: US 7,675,717 B2
(45) Date of Patent: Mar. 9, 2010

(54) MAGNETIC READ HEAD HAVING INCREASED ELECTRON EXCHANGE

(75) Inventors: Wen-Yaung Lee, San Jose, CA (US); Jinshan Li, San Jose, CA (US); Daniele Mauri, San Jose, CA (US); Brian R. York, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 578 days.

(21) Appl. No.: 11/638,271

(22) Filed: Dec. 12, 2006

(65) Prior Publication Data

US 2008/0137236 A1 Jun. 12, 2008

(51) Int. Cl.
*G11B 5/33* (2006.01)
(52) U.S. Cl. .................................. 360/324.11
(58) Field of Classification Search ........................ None
See application file for complete search history.

(56) References Cited

U.S. PATENT DOCUMENTS

| | | | |
|---|---|---|---|
| 6,504,688 | B2 | 1/2003 | Hasegawa et al. |
| 6,754,056 | B2 | 6/2004 | Ho et al. |
| 6,847,547 | B2 | 1/2005 | Albert et al. |
| 2004/0095691 | A1 | 5/2004 | Lin et al. |
| 2004/0207960 | A1 | 10/2004 | Saito et al. |
| 2004/0207962 | A1 | 10/2004 | Saito et al. |
| 2005/0007707 | A1 | 1/2005 | Gill |
| 2005/0024793 | A1 * | 2/2005 | Nakabayashi et al. .. 360/324.11 |
| 2005/0068694 | A1 | 3/2005 | Nakabayashi et al. |
| 2005/0135021 | A1 * | 6/2005 | Hasegawa et al. ...... 360/324.11 |
| 2005/0190508 | A1 | 9/2005 | Gill |
| 2005/0243474 | A1 | 11/2005 | Gill |
| 2005/0243476 | A1 | 11/2005 | Gill |
| 2005/0243478 | A1 | 11/2005 | Pinarbasi |

\* cited by examiner

*Primary Examiner*—Mark Blouin
(74) *Attorney, Agent, or Firm*—Patent Law Offices of Larry Guernsey; Larry B. Guernsey

(57) ABSTRACT

A magnetic head of either CIP or CPP configuration is disclosed, having a read sensor with a strongly pinned ferromagnetic layer due to increased electronic exchange with the AFM layer. The read sensor includes a lower seed layer whose material is chosen from a group consisting of Ta, NiFeCr, NiFeCoCr, NiFe, Cu, Ta/NiFeCr, Ta/NiFeCr/NiFe, Ta/Ru and Ta/NiFeCoCr, and an upper seed layer where the upper seed layer material is chosen from a group consisting of Ru, Cu, NiFe, $Cu(x)Au(1-x)(x=0.22-0.5)$ alloys, $Ru(x)Cr(1-x)(x=0.1-0.5)$ alloys, NiFeCr and NiFeCoCr. An AFM layer is formed on the upper seed layer and a ferromagnetic pinned layer is formed on the AFM layer. The exchange coupling energy Jk between the AFM layer and pinned layers exceeds 1.3 erg/cm2. Also disclosed is a method of fabrication of a magnetic head including a read head sensor with a strongly pinned ferromagnetic layer due to increased electronic exchange.

24 Claims, 6 Drawing Sheets

MAGNETIC READ HEAD HAVING INCREASED ELECTRON EXCHANGE

BACKGROUND OF THE INVENTION

1. Field of the Invention

The present invention relates generally to magnetic heads for reading data written to storage media, and more particularly to magnetic read heads for disk drives.

2. Description of the Prior Art

A computer disk drive stores and retrieves data by positioning a magnetic read/write head over a rotating magnetic data storage disk. The head, or heads, which are typically arranged in stacks, read from or write data to concentric data tracks defined on surface of the disks which are also typically arranged in stacks. The heads are included in structures called "sliders" onto which the read/write sensors of the magnetic head are fabricated. The slider flies above the surface of the disks on a thin cushion of air, and the surface of the slider which faces the disks is called an Air Bearing Surface (ABS).

The goal in recent years is to increase the amount of data that can be stored on each hard disk. If data tracks can be made narrower, more tracks will fit on a disk surface, and more data can be stored on a given disk. The width of the tracks depends on the width of the read/write head used, and in recent years, track widths have decreased as the size of read/write heads has become progressively smaller. This decrease in track width has allowed for dramatic increases in the recording density of data stored on disks.

A magnetic recording head reads back the information stored as magnetic data bits in the recording medium based on the mechanism that the read sensor's resistance changes with the magnetic field of the data bits. A recording head typically consists of, among other structures, a pinned magnetic layer and a free magnetic layer. The magnetic moment of free layer rotates freely in response to the external magnetic field, e.g., the magnetic field from the recording medium. The magnetic orientation of the pinned layer, by contrast, should be fixed firmly. The magnitude of the read sensor's resistance change is determined by the relative angle between the magnetic moments of the free layer and the pinned layer.

The magnetic moment of the pinned layer is typically fixed by fabricating the pinned layer on an antiferromagnetic (AFM) pinning layer which fixes the magnetic moment of the pinned layer at an angle of 90 degrees to the air bearing surface (ABS).

The free layer material is very soft material, magnetically speaking, with very low coercivity, which is a measure of the minimum field strength necessary to make changes in the orientation of the magnetic domains. The magnetic moment of the free layer is free to rotate laterally within the layer with respect to the ABS from a quiescent or zero bias point position in response to magnetic field signals from data bits located on the rotating magnetic disk. The sensitivity of the sensor is quantified as the magnetoresistive coefficient dr/R where dr is the change in resistance of the sensor from minimum resistance to maximum resistance and R is the resistance of the sensor at minimum resistance.

As referred to above, it is common practice in the art to pin the pinned layer by using a layer of anti-ferromagnetic (AFM) material, which is referred to as the pinning layer. The orientation of the magnetic domains of the AFM pinning layer of the read sensors, and thus the orientation of the pinned layer, is set during the wafer fabrication, typically when the sensor layers are still in the form of continuous thin films. The sensor thin film layers are then processed to their final dimensions.

Magnetization in materials is produced by the alignment of dipoles in the material. Materials in which adjacent dipoles are aligned in the same direction are called ferromagnetic, and are found at room temperature in elements such as iron, nickel, cobalt and gadolinium. The alignment of dipoles results in a net macroscopic moment in the material. In contrast, anti-ferromagnetic (AFM) material has magnetic dipoles which point in opposite directions thus producing no net magnetic moment in the material.

The tendency for neighboring atomic dipoles to line up parallel or antiparallel to each other is called exchange coupling, which results from the overlap of orbiting electrons on adjacent atoms. AFM material when fabricated in contact with ferromagnetic material will tend to lock the orientation of dipoles in the ferromagnetic material by this exchange coupling, as is well known to those skilled in the art. The strength of the exchange coupling is measured by the exchange energy coupling constant Jk, which is measured in erg/cm2. The value of Jk for AFM materials is typically in the range of approximately 0.3-0.4. erg/cm2. The layer of AFM material is typically the thickest layer in the read sensor stack, since a minimum volume of AFM material with Jk in this typical range is required to effectively pin the material in the pinned ferromagnetic layer. Assuming that a minimum value of exchange energy coupling Jk is necessary to securely pin the material in the ferromagnetic layer, then if the Jk value could be increased, i.e. higher erg/cm2, then a smaller volume of AFM material could be used to achieve this required minimum value. The volume, and therefore the thickness of the AFM material layer could be decreased thus allowing for the dimensions of the read sensor and the magnetic head as a whole to be decreased In fabricating the central sensor stack of a read head, the left and right sides of the sensor stack are defined by ion milling, which thus defines the track width of the sensor. The rear side of the sensor is also defined by ion milling. The front face of the sensor, which faces the recording medium and which will be part of the Air Bearing Surface (ABS), is typically reduced to the operational dimension by a mechanical lapping process. The dimension of the front face to the rear side is known as the stripe height. Both the track width and stripe height are very important to the operating characteristics of the read head and are very tightly controlled during fabrication.

It has been discovered while the pinned layers are well aligned when they are still in the full-film stage on the wafer, they are often mis-aligned when the sensors are reduced to the final dimensions. This misalignment may be caused by damage generated during the ion-milling and lapping process, or be fundamentally due to a re-definition of the boundary conditions of the small volume of magnetic material within the sensor. It is generally true that the smaller the sensor, the more serious is the misalignment. As the recording density becomes increasingly higher, all the dimensions of the read sensor, stripe-height, width and thickness are shrinking, and consequently the misalignment of the pinned layer becomes a more serious problem. An AFM material with a larger value of Jk would pin the ferromagnetic material more securely, and thus would be less vulnerable to damage from ion-milling and lapping.

A paper entitled Giant Exchange Anisotropy Observed in MnIr/CoFe Bilayers Containing Ordered Mn3Ir Phase by Imakita et al, Tohoku University, APL 85,3812 (2004) discloses the production of a Jk value of 1.3 erg/cm2. However, the conditions used therein to produce the depositions are considered not practical for implementation in a fabrication process. Specifically, an ultra high vacuum deposition ($10^{-11}$ torr) device was used with ultra high purity argon in a DC magnetron sputtering system. The temperature ramp was very rapid, around 250 degrees C. in 10 min with a post annealing temperature of 320 degrees C. The highest Jk values were produced when an L12 ordered phase crystal lattice in the AFM material was formed during repeated annealings. A very thick Cu seedlayer was used, which is considered not practical for magnetic head manufacturing processes.

Thus there is need for a method and structure which increases the exchange energy coupling Jk of AFM material in a manufacturing process, thus pinning the ferromagnetic pinned material more securely and allowing for thinner layers of AFM material to be used, and allowing for the overall volume of the sensor to be reduced.

SUMMARY OF THE INVENTION

A preferred embodiment of the present invention is a magnetic head of either CIP or CPP configuration, having a read sensor with a strongly pinned ferromagnetic layer due to increased electronic exchange with the AFM layer. The read sensor includes a lower seed layer where the lower seed layer material is chosen from a group consisting of Ta, NiFeCr, NiFeCoCr, NiFe, Cu, Ta/NiFeCr, Ta/NiFeCr/NiFe, Ta/Ru and Ta/NiFeCoCr, and an upper seed layer where the upper seed layer material is chosen from a group consisting of Ru, Cu, NiFe, Cu(x)Au(1-x)(x=0.22-0.5) alloys, Ru(x)Cr(1-x) (x=0.1-0.5) alloys, NiFeCr and NiFeCoCr. An AFM layer is formed on the upper seed layer and a ferromagnetic pinned layer is formed on the AFM layer. This AFM material is preferably Ir—Mn or IrMnX (X=Cr,Fe,Ni). The exchange energy coupling Jk of the AFM layer material exceeds 1.3 erg/cm2.

Also disclosed is a method of fabrication of a magnetic head including a read head sensor which includes depositing lower and upper seed layers which have been chosen from a groups listed above, depositing an AFM layer on the upper seed layer at a temperature greater than 100 degrees C., depositing a ferromagnetic pinned layer on the AFM layer to form a partial sensor stack and post-annealing the partial sensor stack at a temperature in the range of 200 degrees C. to 250 degrees C. for a time span greater than 24 hours.

It is an advantage of the magnetic head of the present invention that the strength of the pinning effect of the AFM layer is increased.

It is another advantage of the magnetic head of the present invention that the pinned layer is more stable and less prone to misalignment than in prior art read sensors.

It is yet another advantage of the magnetic head of the present invention that a thinner layer of AFM material may be used to pin the pinned layer of the sensor.

It is a further advantage of the magnetic head of the present invention that the overall thickness of the read sensor may be decreased due to a thinner AFM layer.

It is an advantage of the method of fabricating a magnetic head of the present invention that production yields are increased due to increased stability of the pinned layers.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

Figure 1:
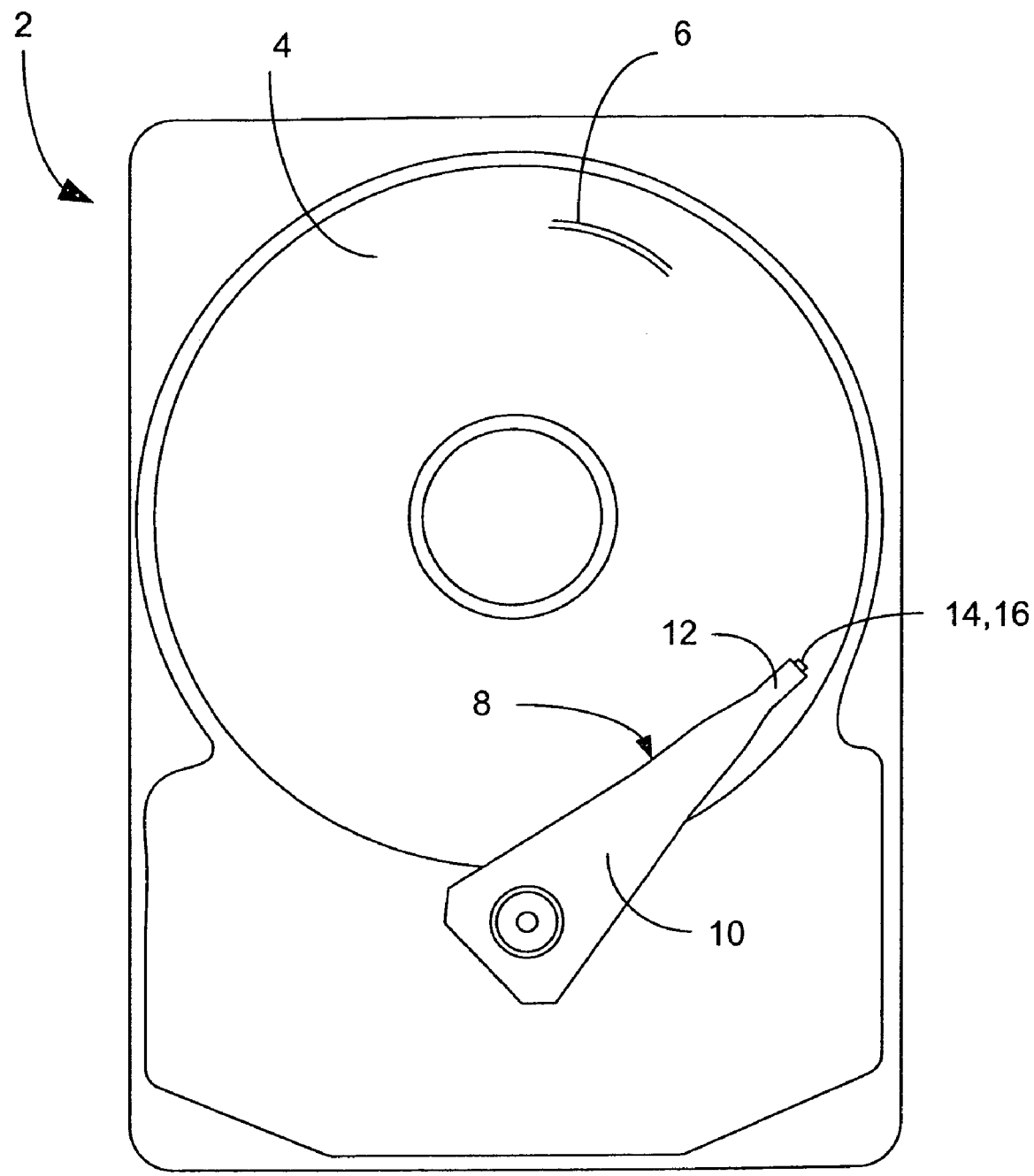
FIG. 1 shows a top plan view of an exemplary disk drive.

A magnetic disk drive 2 is shown generally in FIG. 1, having one or more magnetic data storage disks 4, with data tracks 6 which are written and read by a data read/write device 8. The data read/write device 8 includes an actuator arm 10, and a suspension 12 which supports one or more magnetic heads 14 included in one or more sliders 16.

Figure 2:
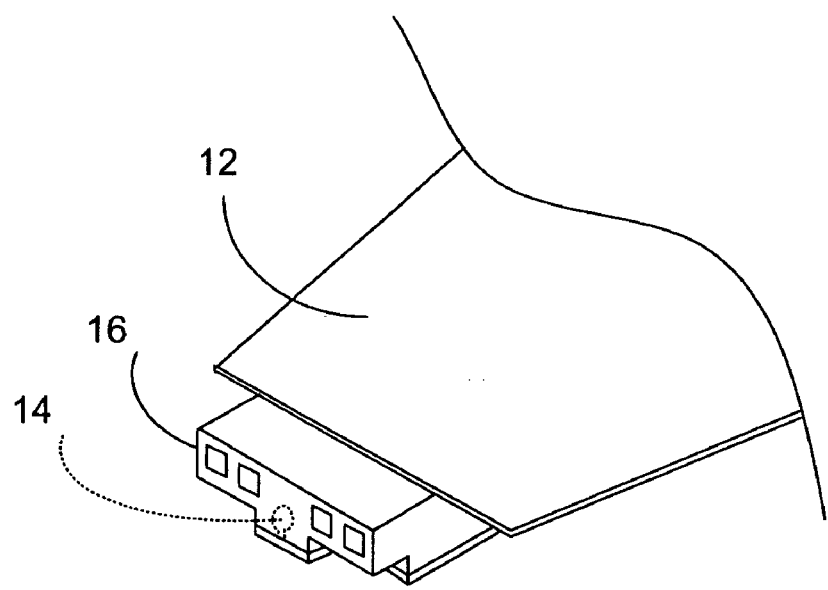
FIG. 2 illustrates a perspective view of view of an exemplary slider and suspension.
Figure 3:
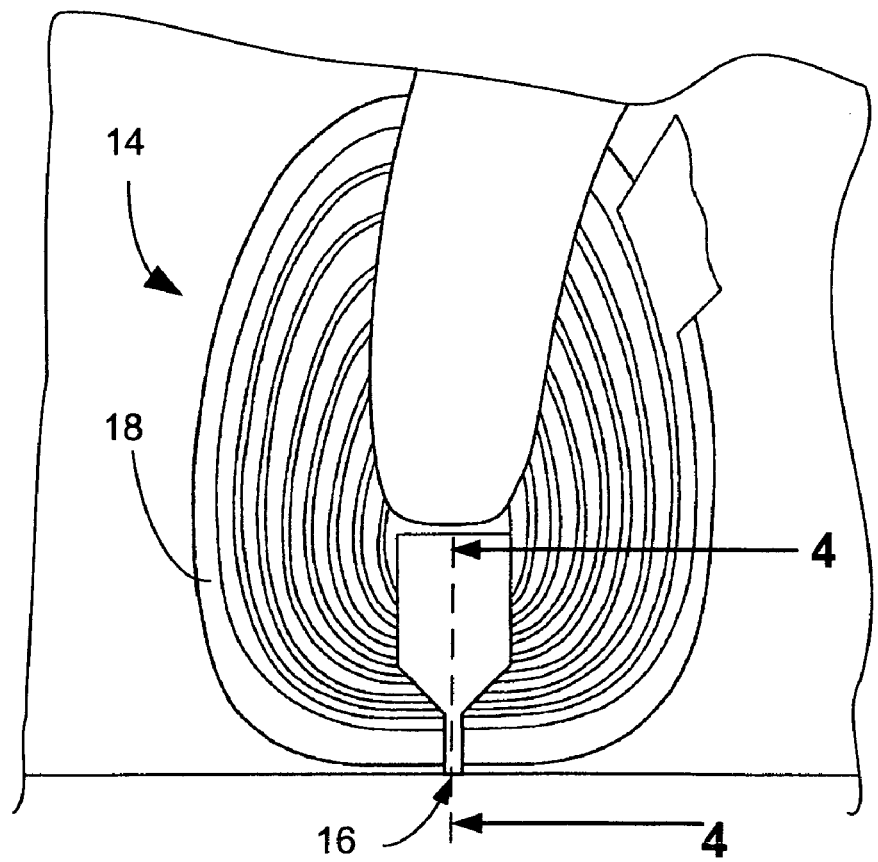
FIG. 3 shows a top plan view of an exemplary read/write head.
Figure 4:
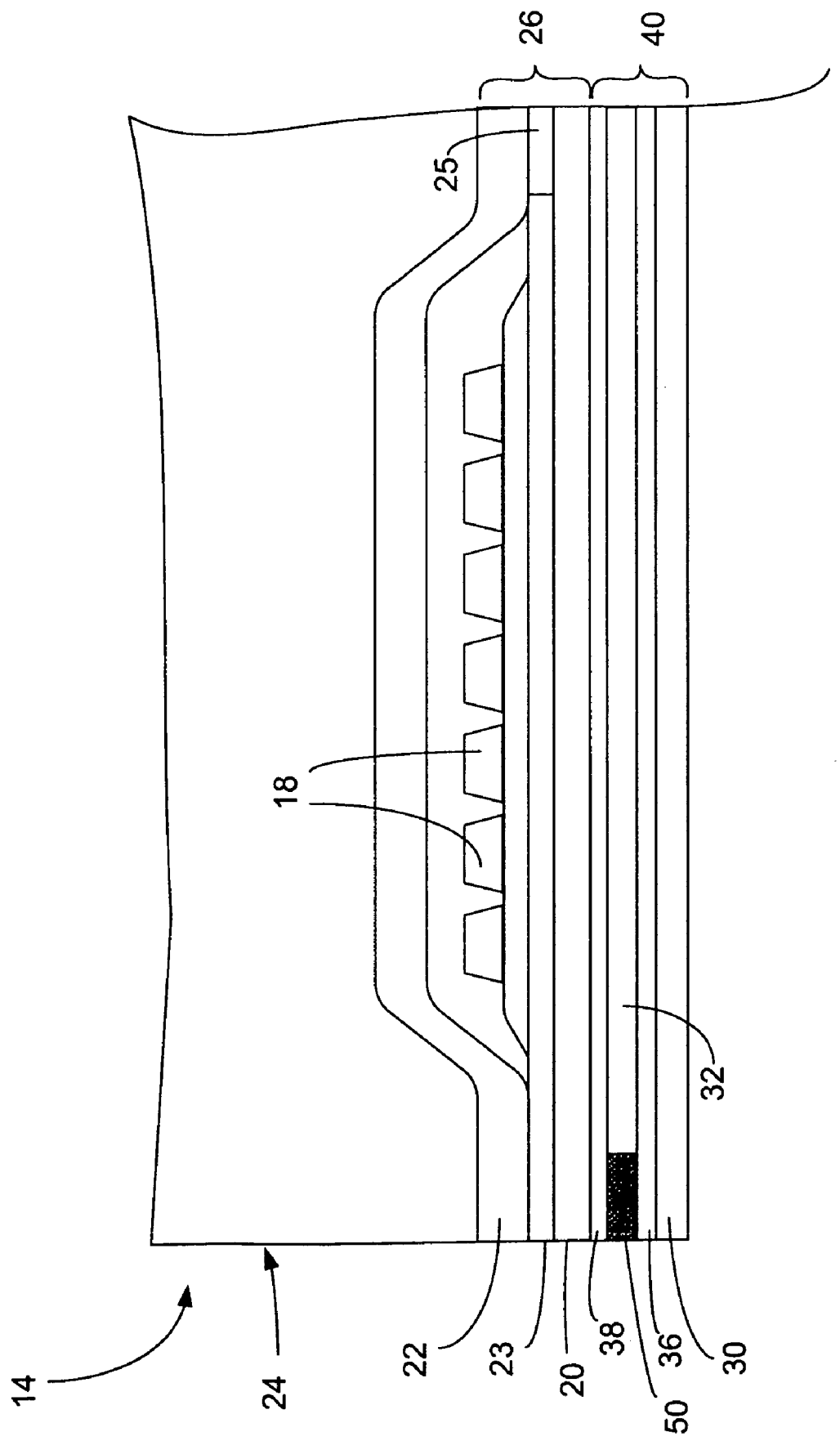
FIG. 4 is a cross-section view of an exemplary CIP read/write head.

FIG. 2 shows a slider 16 in more detail being supported by suspension 12. The magnetic head 14 is shown in dashed lines, and in more detail in FIGS. 3 and 4.

There are two configurations of read head in common use in the industry today. These are called Current In the Plane (CIP) and Current Perpendicular to the Plane (CPP), where the plane of reference is that of the layers of sensor stack material. The magnetic head 14 shown in FIG. 4 has a read head of a configuration known as Current In the Plane (CIP) 40 in which the current flows perpendicularly in and out of the plane of the paper in the pictured figure rather than vertically or horizontally. The magnetic head 14 includes an induction coil 18, a first magnetic pole P1 20, and a second magnetic pole P2 22 which is separated from the P1 pole 20 by write gap layer 23. A backgap piece 25 joins the first and second magnetic poles rearwardly of the induction coil. The P1 pole 20, second pole P2 22 backgap 25 and write gap 23 can be considered together to be included in the write head 26. For CIP read heads, the read sensor 50 is generally sandwiched between two insulation layers, usually designated G1 36 and G2 38 which are made of non-conductive material, to keep the read head sensor circuit from shorting out. Two magnetic shields 30 and 20 (where the P1 pole also serves as a second magnetic shield) sandwich the G1 36 and G2 38 insulation layers. The magnetic head 14 flies on an air cushion between the surface of the disk 4 (see FIG. 1) and the air bearing surface (ABS) 24 of the slider 16.

Figure 5:
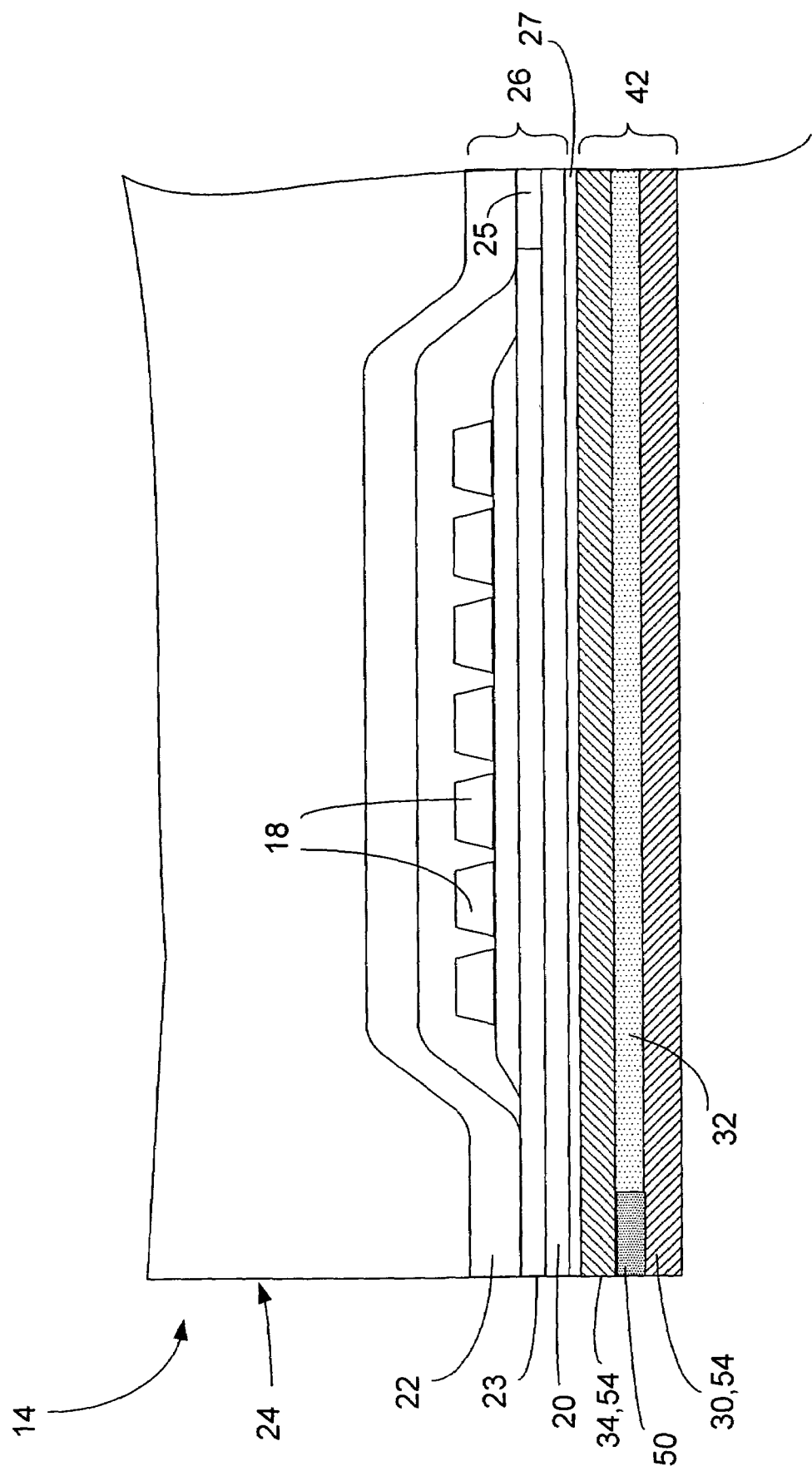
FIG. 5 is a cross-section view of an exemplary CPP read/write head.

The magnetic head 14 shown in FIG. 5 is of a configuration known as known as Current Perpendicular to Plane (CPP) 42, meaning that current flows vertically in the pictured figure rather than horizontally or perpendicularly in and out of the plane of the paper. The magnetic head 14 includes a coil 18, a first magnetic pole P1 20, and a second magnetic pole P2 22 which is separated from P1 pole 20 by write gap layer 23. A backgap piece 25 joins the first and second magnetic poles rearwardly of the induction coil. The P1 pole 20, second pole P2 22, backgap 25 and write gap 23 can be considered together to be included in the write head 26.

A read sensor 50 is sandwiched between a first magnetic shield, designated as S1 30 and a second magnetic shield S2 34, and these elements together make up the read head 42. In this configuration of read head 42 where Current is Perpendicular to the Plane (CPP), shields S1 30 and S2 34 act as electrical leads 54 supplying current to the read sensor 50 which lies between them. An insulation layer 27 is disposed between the S2 shield 34 and the P1 pole 20 to limit unwanted signal noise. An insulation layer 32 also separates the S1 30 and S2 34 electrical leads in the area behind the read sensor 50, so that they do not short out along their length. The magnetic head 14 flies on an air cushion between the surface of the disk 4 (see FIG. 1) and the air bearing surface (ABS) 24 of the slider 16.

Figure 6:
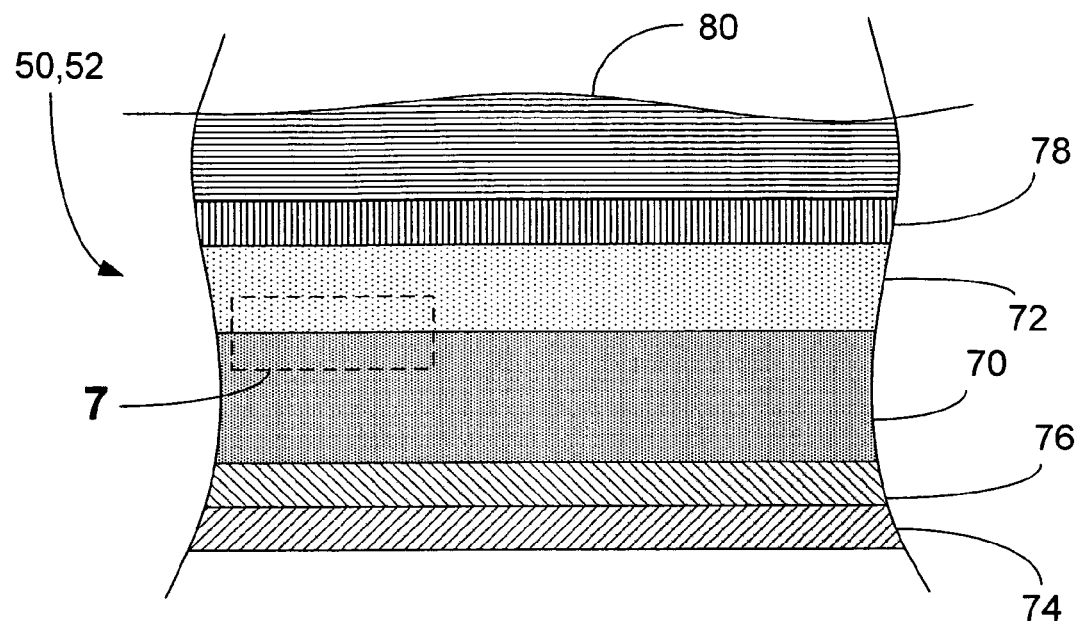
FIG. 6 is a front plan view of a portion of an exemplary sensor stack viewed from the ABS.

The present invention is designed to work with both CIP and CPP configuration sensors. A read head sensor 50 including a read sensor stack 52 is typically constructed with layers which are included as shown in FIG. 6, which is a front plan view as seen from the Air Bearing Surface (ABS). It will be understood that a read head sensor includes other layers not shown here and that there are many variations possible in the configuration of the layers which are shown here, but the sensor stack 52 has been simplified for purposes of this discussion.

FIG. 6 shows a front plan view of a portion of a read sensor 50 of the present invention. Two seedlayers are shown, to be designated lower seedlayer 74 and upper seedlayer 76. An AFM layer 70 is shown formed on the upper seedlayer 76 and the pinned layer 72 is formed on the AFM layer 70. A nonmagnetic spacer layer 78 is formed on the pinned layer 72, and the free layer 80 is formed on the spacer layer 78. It is to be understood that these may be followed by further layers as is generally known in the art, but these will not be discussed here.

Figure 7:
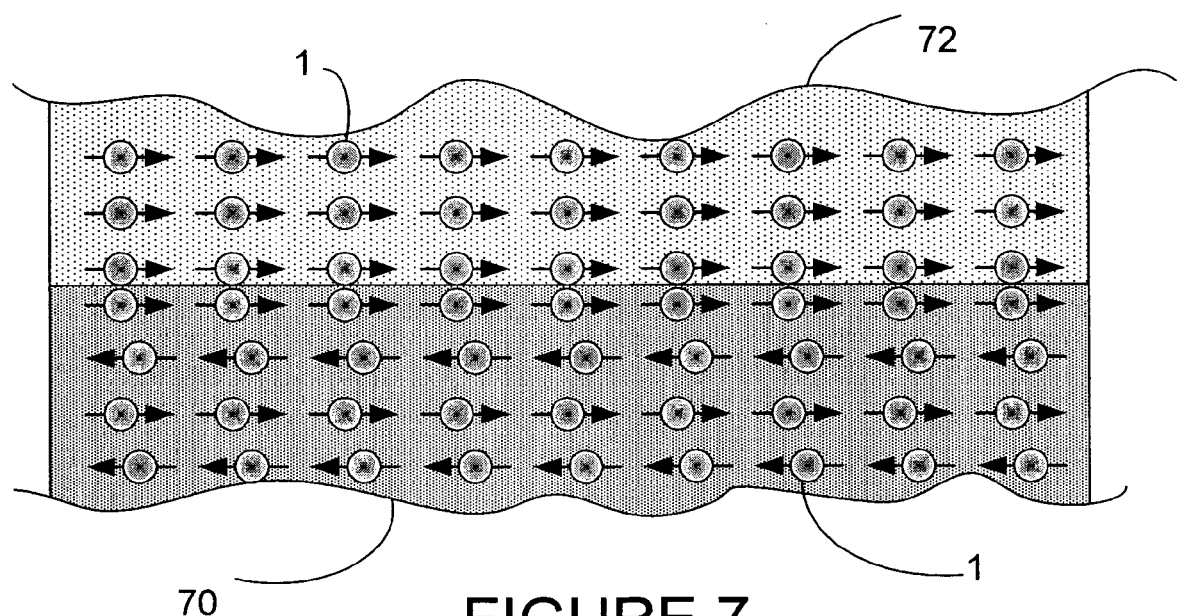
FIG. 7 is an detail view of the boundary between a ferromagnetic material and an anti-ferromagnetic material of FIG. 6, showing exchange coupling.

As discussed above, the tendency for neighboring atomic dipoles to line up parallel or antiparallel to each other is called exchange coupling, which results from the overlap of orbiting electrons on adjacent atoms. AFM material when fabricated in contact with ferromagnetic material will tend to lock the orientation of dipoles in the ferromagnetic material by this exchange coupling. FIG. 7 shows a detail view of the area in box 7 of FIG. 6, which is a simplified illustration of the magnetic dipoles in ferromagnetic pinned layer 72 and the anti-ferromagnetic pinning layer 70 due to exchange coupling. The anti-ferromagnetic pinning layer 70 is shown with layer of magnetic dipoles 1 pointing in alternating directions in adjacent layers. The magnetic dipoles 1 in the ferromagnetic pinned layer 72 are shown to be all aligned with the top layer of dipoles 1 in the anti-ferromagnetic pinning layer 70. The anti-ferromagnetic pinning layer 70 thus acts as a permanent biasing layer that keeps the alignment of the ferromagnetic pinned layer 72 oriented with the anti-ferromagnetic pinning layer 70 due to exchange coupling.

The strength of the exchange coupling is measured by the exchange energy coupling Jk, which is measured in erg/cm2. The value of Jk for AFM materials is typically in the range of 0.3-0.4. erg/cm2. The layer of AFM material 70 is typically the thickest layer in the read sensor stack, since a minimum volume of AFM material with Jk in this typical range is required to effectively pin the material in the ferromagnetic layer 72. Assuming that a minimum value of exchange energy coupling is necessary to securely pin the material in the ferromagnetic layer, then if the Jk value could be increased, i.e. higher erg/cm2, then a smaller volume of AFM material could be used to achieve this required minimum value. The volume, and therefore the thickness of the AFM material layer could be decreased thus allowing for the dimensions of the read sensor and the magnetic head as a whole to be decreased As discussed above, the strength of the exchange coupling energy which serves to pin the orientation of the ferromagnetic pinned layer is measured by the exchange energy coupling Jk, which is measured in erg/cm2. The value of Jk is expressed in the following equation $$Jk = H_{ex} * \text{CoFe film thickness} * M_s(\text{CoFe}) \text{ in NiFe equivalent magnetic thicknesses} * 700 \text{ emu/cc}$$

where $H_{ex}$ is the exchange coupling field measured in Oe, (shift of BH loop from origin). The CoFe film thickness is measured in NiFe equivalent thicknesses (in angstroms). $M_s$ is the saturation magnetization of NiFe and is taken as 700 emu/cc and was obtained by calibrating a known thickness of NiFe thin film sample against a National Bureau of Standards Ni standard. CoFe magnetic thickness ~2×NiFe thickness.

The value of Jk for AFM materials using conventional manufacturing processes is typically in the range of 0.3-0.4. erg/cm2. The present invention produces Jk values of 1.3 erg/cm2 and above. The production of AFM material having high Jk values equal to or greater than 1.3 erg/cm2 is thought to be related to strain in the AFM material. This AFM material is preferably Ir—Mn or IrMnX (X=Cr,Fe,Ni), and IrMn strain is effected by seedlayer type and composition, gas pressure, deposition temperature, post annealing time, and IrMn concentration. Thus, the preferred method of AFM layer fabrication preferably includes at least 3 processing operations, as practiced in the present invention. These include 1) deposition of at least two seed layers, including the lower seedlayer 74 and the upper seed layer 76 discussed above, 2) deposition and annealing of the AFM material 70 at elevated temperatures, and 3) post-annealing processing. Optionally, the deposition of the seed layers may optionally include the use of higher pressure Argon gas during the deposition processes.

Figure 8:
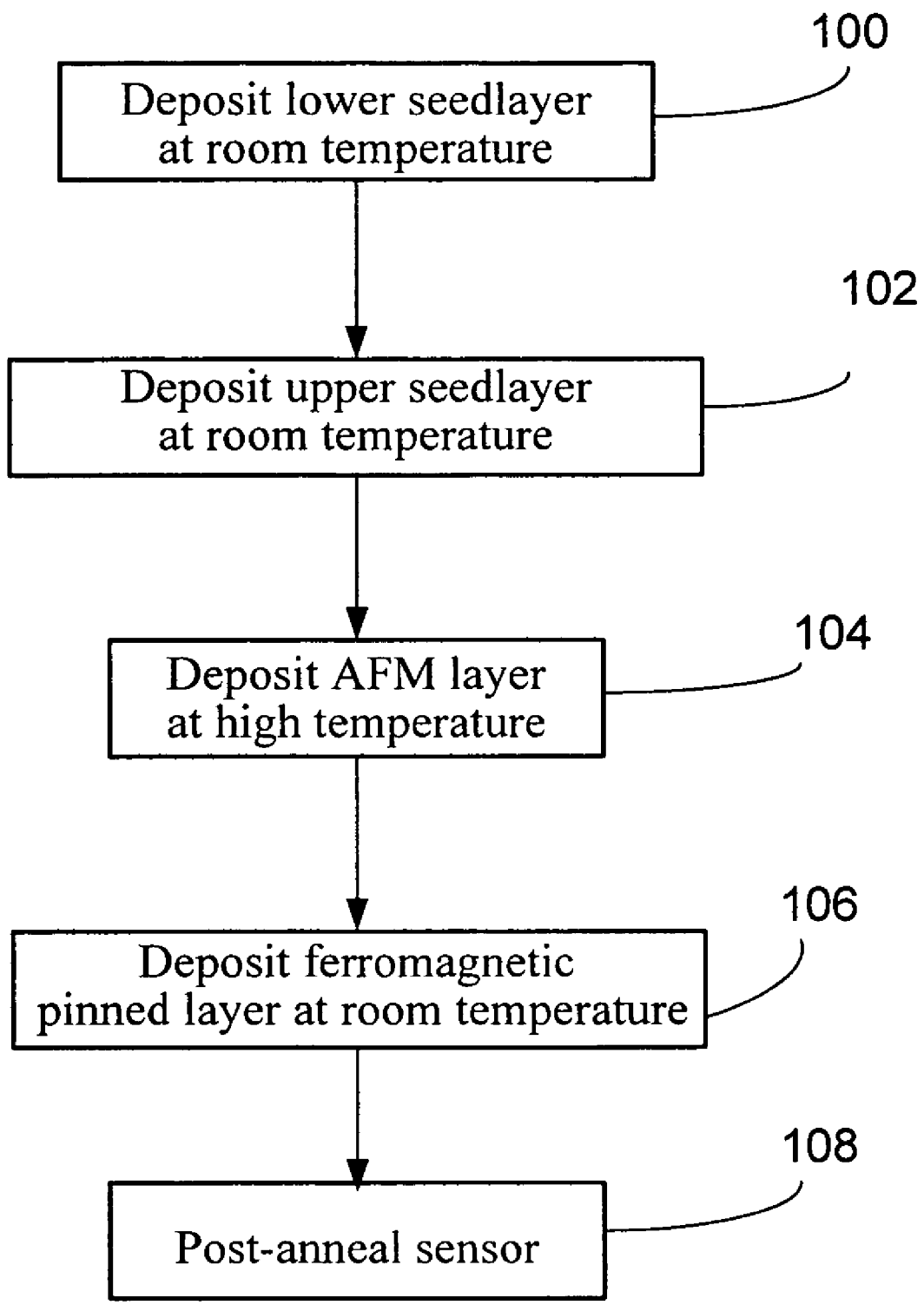
FIG. 8 is a flowchart of the stages in fabrication of a magnetic head having increased electron exchange coupling.

The fabrication method will next be described with reference to FIG. 8, as well as to FIG. 6. FIG. 8 shows a flowchart of the method of the present invention.

As discussed above, the two seed layers are designated as lower seedlayer 74 and upper seedlayer 76 in FIG. 6. The preferred composition of these seed layers is chosen from groups including the following materials:

The lower seedlayer 74 is preferably chosen from Ta, NiFeCr, NiFeCoCr, NiFe, Cu, Ta/NiFeCr, Ta/NiFeCr/NiFe, Ta/Ru and Ta/NiFeCoCr seedlayers. The preferred composition for NiFeCr is Ni0.50Fe0.12Cr0.38 and that of NiFeCoCr is Ni0.43Fe0.04Co0.13Cr0.40 however sputter process conditions can change the measured film compositions from these preferred values.

The upper seedlayer 76 is preferably chosen from Ru, Cu, NiFe, Cu(x)Au(1-x)(x=0.22-0.5) alloys, Ru(x)Cr(1-x) (x=0.1-0.5) alloys, NiFeCr and NiFeCoCr. These alloys would include the more specific cases of Cu(x)Au(1-x) (x=0.22-0.5)Au alloys, Ru(x)Cr(1-x)(x=0.1-0.5) alloys, Ru28Cr, Cu22Au, and Cu50Au. Generally, seedlayers in which the lattice structure has better lattice matching with the lattice structure of the IrMn AFM material works best, where the lattice structure of the IrMn AFM layer is (fcc)

A preferred thickness for the lower seedlayer is greater than 10 Å and the upper seedlayer is in a range of from 40 Å to 500 Å.

Referring to FIG. 8, the lower seedlayer is deposited at room temperature 100, of the preferred composition and in the preferred thickness range discussed above. The upper seedlayer is then deposited at room temperature 102, also in the preferred thickness range and of the preferred composition discussed above. As stated above, the deposition of the seedlayers operation optionally includes the use of Argon gas during the deposition processes, using gas pressures which are preferably greater than 2 mtorr. The optional use of Ar gas is not shown, but would be practiced at the time of the seed-layer depositions 100, 102.

As for the second operation, deposition of the AFM material at elevated temperatures, a film temperature of greater than 100 degrees C. is used and a preferred range of temperatures for this process is between 200 degrees C. and 250 degrees C. This temperature is preferably achieved through a "ramp up" process which achieves its peak temperature during a time span greater than 24 hrs and preferably greater than 72 hours.

In FIG. 8, the AFM layer is deposited at high temperature 104, in the preferred temperature range, and of the preferred composition discussed above. The ferromagnetic pinned layer is then deposited 106 at room temperature.

The third operation is post-annealing, which is an annealing process which takes place at elevated temperatures for an extended period of time. It preferably done after the initial stack deposition and after annealing, if any, of the pinned layer, and thus is referred to as "post-annealing". In experiments, this process was initially conducted at 285 degrees C., however the process produced more of a benefit from longer annealing times than higher post-annealing temperatures. It was found that post-annealing at 240 degrees C. for many hours (more than 24 hr.) was preferred. Preferred ranges of times and temperatures have been found to include temperatures greater than 200 degrees C. and less than 250 degrees C. for at least 24 hours and preferably more than 72 hours. This is shown in FIG. 8 where the sensor is post-annealed 108.

Another optional aspect of the present invention is the use of a relatively high Ir content in the Ir—Mn AFM alloy, with Ir concentrations in the range of 28 to 31%.

Thus the present invention can produce AFM materials having Jk values of 1.3 erg/cm2 and above for better pinning, while using processes which are more easily achieved in a conventional manufacturing facility.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

What is claimed is:

1. A magnetic head comprising:
   a read sensor having:
   a lower seed layer wherein said lower seed layer is chosen from a group consisting of Ta, NiFeCr, NiFeCoCr, NiFe, Cu, Ta/NiFeCr, Ta/NiFeCr/NiFe, Ta/Ru and Ta/NiFeCoCr;
   an upper seed layer wherein said upper seed layer is chosen from a group consisting of Ru, Cu, NiFe, $Cu(x)Au(1-x)$ ($x=0.22-0.5$) alloys, $Ru(x)Cr(1-x)$ ($x=0.1-0.5$) alloys, NiFeCr and NiFeCoCr;
   an AFM layer formed on said upper seed layer; and
   a ferromagnetic pinned layer formed on said AFM layer to form a partial sensor stack, wherein said partial sensor stack said post-annealing is done at a temperature in the range of 200 degrees C. to 250 degrees C. for a time span greater than 24 hours to produce a pinned layer which is pinned by exchange coupling with said AFM layer, where said exchange coupling energy has a Jk value of at least 1.3 erg/cm2.

2. The magnetic head of claim 1, wherein:
   said AFM material is chosen from a group consisting of Ir—Mn or IrMnX (X=Cr,Fe,Ni).

3. The magnetic head of claim 2, wherein:
   the concentration of Ir in said AFM material is in the range of 28 to 31%.

4. The magnetic head of claim 1, wherein said a lower seed layer has a thickness which is greater than 10 Angstroms.

5. The magnetic head of claim 1, wherein said upper seed layer has a thickness which lies in the range of 40 Angstroms to 500 Angstroms.

6. The magnetic head of claim 1, wherein said read sensor is of CIP configuration.

7. The magnetic head of claim 1, wherein said read sensor is of CPP configuration.

8. A disk drive comprising:
   at least one hard disk;
   at least one magnetic head adapted to fly over said hard disk for reading data on said hard disk, and having an air bearing surface, said magnetic head including:
   a magnetic read sensor having:
   a lower seed layer wherein said lower seed layer is chosen from a group consisting of Ta, NiFeCr, NiFeCoCr, NiFe, Cu, Ta/NiFeCr, Ta/NiFeCr/NiFe, Ta/Ru and Ta/NiFeCoCr;
   an upper seed layer wherein said upper seed layer is chosen from a group consisting of Ru, Cu, NiFe, $Cu(x)Au(1-x)$ ($x=0.22-0.5$) alloys, $Ru(x)Cr(1-x)$ ($x=0.1-0.5$) alloys, NiFeCr and NiFeCoCr;
   an AFM layer formed on said upper seed layer; and
   a ferromagnetic pinned layer formed on said AFM layer to form a partial sensor stack, wherein said partial sensor stack said post-annealing is done at a temperature in the range of 200 degrees C. to 250 degrees C. for a time span greater than 24 hours to produce a pinned layer which is pinned by exchange coupling with said AFM layer, where said exchange coupling energy has a Jk value of at least 1.3 erg/cm2.

9. The disk drive of claim 8, wherein:
   said AFM material is chosen from a group consisting of Ir—Mn or IrMnX (X=Cr,Fe,Ni).

10. The disk drive of claim 9, wherein:
    the concentration of Ir in said AFM material is in the range of 28 to 31%.

11. The disk drive of claim 8, wherein said lower seed layer has a thickness which greater than 10 Angstroms.

12. The disk drive of claim 8, wherein said upper seed layer has a thickness which lies in the range of 40 Angstroms to 500 Angstroms.

13. The disk drive of claim 8, wherein said read sensor is of CIP configuration.

14. The disk drive of claim 8, wherein said read sensor is of CPP configuration.

15. A method of fabrication of a magnetic head including a read head sensor comprising:
   A) depositing a lower seed layer wherein said lower seed layer is chosen from a group consisting of Ta, NiFeCr, NiFeCoCr, NiFe, Cu, Ta/NiFeCr, Ta/NiFeCr/NiFe, Ta/Ru and Ta/NiFeCoCr;
   B) depositing an upper seed layer wherein said upper seed layer is chosen from a group consisting of Ru, Cu, NiFe, $Cu(x)Au(1-x)$ ($x=0.22-0.5$) alloys, $Ru(x)Cr(1-x)$ ($x=0.1-0.5$) alloys, NiFeCr, and NiFeCoCr;
   C) depositing an AFM layer on said upper seed layer wherein said deposition of said AFM layer is done at a temperature greater than 100 degrees C.;
   D) depositing a ferromagnetic pinned layer on said AFM layer to form a partial sensor stack; and E) post-annealing said partial sensor stack wherein said post-annealing is done at a temperature in the range of 200 degrees C. to 250 degrees C. for a time span greater than 24 hours.

16. The method of claim 15, wherein said post-annealing in E) is conducted for a time span greater than 72 hours.

17. The method of claim 15, wherein said deposition in A) is conducted using Argon gas at a pressure greater than 2 mtorr.

18. The method of claim 15, wherein said deposition in B) is conducted using Argon gas at a pressure greater than 2 mtorr.

19. The disk drive of claim 15, wherein said lower seed layer has a thickness which is greater than 10 Angstroms.

20. The disk drive of claim 15, wherein said upper seed layer has a thickness which lies in the range of 40 Angstroms to 500 Angstroms.

21. The method of claim 15, wherein:
    said AFM material is chosen from a group consisting of Ir—Mn or IrMnX (X=Cr,Fe,Ni).

22. The method of claim 20, wherein:
    the concentration of Ir in said AFM material is in the range of 28 to 31%.

23. The method of claim 15, wherein said read sensor is of CIP configuration.

24. The method of claim 15, wherein said read sensor is of CPP configuration.

\* \* \* \* \*

UNITED STATES PATENT AND TRADEMARK OFFICE
CERTIFICATE OF CORRECTION

| | | |
|---|---|---|
| PATENT NO. | : 7,675,717 B2 | Page 1 of 1 |
| APPLICATION NO. | : 11/638271 | |
| DATED | : March 9, 2010 | |
| INVENTOR(S) | : Lee et al. | |

It is certified that error appears in the above-identified patent and that said Letters Patent is hereby corrected as shown below:

In Claim 22, line 1, which now reads

"22. The method of claim 20, wherein:"

should be changed to read

"22. The method of claim 21, wherein:"

Signed and Sealed this

Eighteenth Day of May, 2010

David J. Kappos
*Director of the United States Patent and Trademark Office*

UNITED STATES PATENT AND TRADEMARK OFFICE
CERTIFICATE OF CORRECTION

PATENT NO.         : 7,675,717 B2                                                                  Page 1 of 1
APPLICATION NO.    : 11/638271
DATED              : March 9, 2010
INVENTOR(S)        : Lee et al.

It is certified that error appears in the above-identified patent and that said Letters Patent is hereby corrected as shown below:

Column 10, In Claim 22, line 7, which now reads

"22. The method of claim 20, wherein:"

should be changed to read

"22. The method of claim 21, wherein:"

This certificate supersedes the Certificate of Correction issued May 18, 2010.

Signed and Sealed this

Fifteenth Day of June, 2010

David J. Kappos
*Director of the United States Patent and Trademark Office*